(12) United States Patent
Wang et al.

(10) Patent No.: US 9,773,906 B2
(45) Date of Patent: Sep. 26, 2017

(54) RELAXED SEMICONDUCTOR LAYERS WITH REDUCED DEFECTS AND METHODS OF FORMING THE SAME

(71) Applicants: Wei-E Wang, Austin, TX (US); Mark S. Rodder, Dallas, TX (US); Ganesh Hedge, Austin, TX (US); Christopher Bowen, Austin, TX (US)

(72) Inventors: Wei-E Wang, Austin, TX (US); Mark S. Rodder, Dallas, TX (US); Ganesh Hedge, Austin, TX (US); Christopher Bowen, Austin, TX (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/002,078

(22) Filed: Jan. 20, 2016

(65) Prior Publication Data

US 2016/0322493 A1    Nov. 3, 2016

Related U.S. Application Data

(60) Provisional application No. 62/154,009, filed on Apr. 28, 2015.

(51) Int. Cl.
*H01L 21/336* (2006.01)
*H01L 29/78* (2006.01)
(Continued)

(52) U.S. Cl.
CPC ...... *H01L 29/7848* (2013.01); *H01L 21/0245* (2013.01); *H01L 21/0265* (2013.01);
(Continued)

(58) Field of Classification Search
None
See application file for complete search history.

(56) References Cited

U.S. PATENT DOCUMENTS 5,981,400 A   11/1999   Lo
6,617,062 B2   9/2003   Chang
(Continued)

FOREIGN PATENT DOCUMENTS

| CN | 101188195 A | 5/2008 |
|---|---|---|
| CN | 103035797 A | 4/2013 |
| CN | 103117346 A | 5/2013 |

OTHER PUBLICATIONS

Y. B. Bolkhovityanov, O. P. Pchelyakov, L. V. Sokolov, and S. I. Chikichev, "Artificial GeSi substrates for heteroepitaxy: Achievements and problems," *Semiconductors*, vol. 37, No. 5, pp. 493-518, May 2003.

(Continued)

*Primary Examiner* — David E Graybill
(74) *Attorney, Agent, or Firm* — Myers Bigel, P.A.

(57) ABSTRACT

Methods of forming a layer of silicon germanium include forming an epitaxial layer of $Si_{1-x}Ge_x$ on a silicon substrate, wherein the epitaxial layer of $Si_{1-x}Ge_x$ has a thickness that is less than a critical thickness, hc, at which threading dislocations form in $Si_{1-x}Ge_x$ on silicon; etching the epitaxial layer of $Si_{1-x}Ge_x$ to form $Si_{1-x}Ge_x$ pillars that define a trench in the epitaxial layer of $Si_{1-x}Ge_x$, wherein the trench has a height and a width, wherein the trench has an aspect ratio of height to width of at least 1.5; and epitaxially growing a suspended layer of $Si_{1-x}Ge_x$ from upper portions of the $Si_{1-x}Ge_x$ pillars, wherein the suspended layer defines an air gap in the trench beneath the suspended layer of $Si_{1-x}Ge_x$.

20 Claims, 6 Drawing Sheets

(51) Int. Cl.
  *H01L 21/764* (2006.01)
  *H01L 21/02* (2006.01)
  *H01L 21/308* (2006.01)
  *H01L 29/04* (2006.01)
(52) U.S. Cl.
  CPC .. *H01L 21/02381* (2013.01); *H01L 21/02433* (2013.01); *H01L 21/02513* (2013.01); *H01L 21/02532* (2013.01); *H01L 21/02639* (2013.01); *H01L 21/3081* (2013.01); *H01L 21/764* (2013.01); *H01L 29/045* (2013.01)

(56) References Cited

U.S. PATENT DOCUMENTS

| | | | |
|---|---|---|---|
| 7,750,367 | B2 | 7/2010 | Notsu et al. |
| 8,324,660 | B2 | 12/2012 | Lochtefeld et al. |
| 8,828,849 | B2* | 9/2014 | Wang ............... 257/76 |
| 8,906,487 | B2 | 12/2014 | Shimada |
| 9,054,218 | B2* | 6/2015 | Adam ............ H01L 21/823821 |
| 9,257,538 | B2* | 2/2016 | Mieno ............ H01L 29/66795 |
| 2002/0022290 | A1 | 2/2002 | Kong et al. |
| 2008/0272378 | A1* | 11/2008 | Guo ............ C30B 25/02 257/76 |
| 2008/0272462 | A1* | 11/2008 | Shimamoto ..... H01L 21/02389 257/615 |
| 2009/0079034 | A1* | 3/2009 | Wang ............ H01L 21/02609 257/615 |
| 2009/0174038 | A1* | 7/2009 | Wang ............ C30B 25/00 257/618 |
| 2009/0278140 | A1 | 11/2009 | Huang et al. |
| 2009/0315112 | A1* | 12/2009 | Lee ............ H01L 21/823431 257/355 |
| 2010/0133505 | A1* | 6/2010 | Takao ............ H01L 33/0079 257/13 |
| 2010/0276665 | A1* | 11/2010 | Wang ............ H01L 21/0237 257/15 |
| 2012/0097234 | A1 | 4/2012 | Bojarczuk et al. |
| 2012/0153338 | A1* | 6/2012 | Guo ............ H01L 33/007 257/99 |
| 2012/0161175 | A1* | 6/2012 | Chen ............ H01L 33/0079 257/98 |
| 2012/0235115 | A1* | 9/2012 | Kang ............ H01L 21/0237 257/13 |
| 2014/0120678 | A1* | 5/2014 | Shinriki ............ H01L 29/66795 438/283 |
| 2014/0138790 | A1* | 5/2014 | Sugino ............ H01L 21/764 257/522 |
| 2015/0102393 | A1* | 4/2015 | Mieno ............ H01L 29/66795 257/288 |
| 2015/0318355 | A1* | 11/2015 | Wang ............ H01L 21/02639 438/479 |
| 2016/0111447 | A1* | 4/2016 | Bryant ............ H01L 27/1211 257/347 |
| 2016/0163831 | A1* | 6/2016 | Jacob ............ H01L 29/66795 438/283 |
| 2016/0225676 | A1* | 8/2016 | Jacob ............ H01L 21/845 |
| 2016/0322493 | A1* | 11/2016 | Wang ............ H01L 29/7848 |
| 2016/0359012 | A1* | 12/2016 | Yu ............ H01L 29/4991 |

OTHER PUBLICATIONS

V. Destefanis, D. Rouchon, J. M. Hartmann, A. M. Papon, L. Baud, A. Crisci, and M. Mermoux, "Structural properties of tensily strained Si layers grown on SiGe(100), (110), and (111) virtual substrates," *J. Appl. Phys.*, vol. 106, No. 4, p. 043508, 2009.
G. Eneman, D. P. Brunco, L. Witters, B. Vincent, P. Favia, A. Hikavyy, A. De Keersgieter, J. Mitard, R. Loo, A. Veloso, O. Richard, H. Bender, W. Vandervorst, M. Caymax, N. Horiguchi, N. Collaert, and A. Thean, "(Invited) Stress Simulations of Si- and Ge-Channel FinFETs for the 14 nm-Node and Beyond," *ECS Trans.*, vol. 53, No. 1, pp. 225-236, May 2013.
A. Fischer, H. Kuhne, B. Roos, and H. Richter, "Elastic strain relaxation in patterned heteroepitaxial structures," *Semicond. Sci. Technol.*, vol. 9, No. 12, pp. 2195-2198, Dec. 1994.
Fitzgerald et al. "Dislocations in Relaxed SiGe/Si Heterostructures", *Phys. Stat. Sol.* (a) vol. 171, pp. 227-238 (1999).
L. B. Freund and W. D. Nix, "A critical thickness condition for a strained compliant substrate/epitaxial film system," *Appl. Phys. Lett.*, vol. 69, No. 2, p. 173, 1996.
D.C. Houghton, "Strain Relaxation Kinetics in $Si_{1-x}Ge_x$/Si Heterostructures", *J. Appl. Phys.*, 70(4), Aug. 15, 1991, pp. 2136-2151.
Hartmann et al. "Reduced Pressure-Chemical Vapor Deposition of Intrinsic and Doped Ge Layers on Si(001) for Microelectronics and Optoelectronics Purposes", Journal of Crystal Growth, vol. 274, (2005), pp. 90-99.
K. Hiramatsu, "Epitaxial lateral overgrowth techniques used in group III nitride epitaxy," *J. Phys. Condens. Matter*, vol. 13, No. 32, pp. 6961-6975, Aug. 2001.
J. Molstad, P. Boyd, J. Markunas, D. J. Smith, E. Smith, E. Gordon, and J. H. Dinan, "Epitaxial growth of CdTe on (211) silicon mesas formed by deep reactive ion etching," *J. Electron. Mater.*, vol. 35, No. 8, pp. 1636-1640, Aug. 2006.
Mooney et al. "Elastic Strain Relaxation in Free-Standing SiGe/Si Structures", *Applied Physics Letters*, vol. 84(7), Feb. 16, 2004, pp. 1093-1095.
Arne Nylandsted Larsen, "Epitaxial Growth of Ge and SiGe on Si Substrates", *Materials Science in Semiconductor Processing*, vol. 9 (2006) pp. 454-459.
A. Nutsch and R. Oechsner, "Scenario for a Yield Model Based on Reliable Defect Density Data and Linked to Advanced Process Control," *Semicond. Sci. Technol.*, 2006, vol. 2, pp. 433-452.
D. J. Paul, "Si/SiGe heterostructures: from material and physics to devices and circuits," *Semicond. Sci. Technol.*, vol. 19, No. 10, pp. R75-R108, Oct. 2004.
A. R. Powell, S. S. Iyer, and F. K. LeGoues, "New approach to the growth of low dislocation relaxed SiGe material," *Appl. Phys. Lett.*, vol. 64, No. 14, p. 1856, 1994.
Shinichi Takagi, Toshifumi Irisawa, Tsutomu Tezuka, Shu Nakaharai, Koji Usuda, Norio Hirashita, Mitsuru Takenaka, and Naoharu Sugiyanna, "Carrier-transport-enhanced CMOS using new channel materials and structures," ISDRS 2007, Dec. 12-14, College Park, MD, pp. 1-2.
Tamura et al. "Rearrangement of Misfit Dislocations in GaAs on Si by Post-Growth Annealing", *Journal of Crystal Growth*, vol. 150 (1995), pp. 654-660.
T. Tezuka, N. Sugiyama, S. Takagi, and T. Kawakubo, "Dislocation-free formation of relaxed SiGe-on-insulator layers," *Appl. Phys. Lett.*, vol. 80, No. 19, p. 3560, 2002.
G. Wang, R. Loo, E. Simoen, L. Souriau, M. Caymax, M. M. Heyns, and B. Blanpain, "A model of threading dislocation density in strain-relaxed Ge and GaAs epitaxial films on Si (100)," *Appl. Phys. Lett.*, vol. 94, No. 10, p. 102115, 2009.
Masafumi et al. "Thermal Annealing Effects of Defect Reduction in GaAs on Si Substrates", *J. Appl. Phys.*, vol. 68(9), Nov. 1, 1990, pp. 4518-4522.
X. G. Zhang, A. Rodriguez, X. Wang, P. Li, F. C. Jain, and J. E. Ayers, "Complete removal of threading dislocations from mismatched layers by patterned heteroepitaxial processing," *Appl. Phys. Lett.*, vol. 77, No. 16, p. 2524, 2000.
X. G. Zhang, P. Li, G. Zhao, D. W. Parent, F. C. Jain, and J. E. Ayers, "Removal of threading dislocations from patterned heteroepitaxial semiconductors by glide to sidewalls," *J. Electron. Mater.*, vol. 27, No. 11, pp. 1248-1253, Nov. 1998.

\* cited by examiner

RELAXED SEMICONDUCTOR LAYERS WITH REDUCED DEFECTS AND METHODS OF FORMING THE SAME

RELATED APPLICATIONS

The present application claims the benefit of and priority to U.S. Provisional Patent Application No. 62/154,009, filed Apr. 28, 2015, entitled "Method of forming defect-free, 100% relaxed strain-relief-buffer layers onto lattice-mismatched substrates," the disclosure of which is hereby incorporated herein by reference in its entirety.

BACKGROUND

1. Field

The present disclosure relates to semiconductor materials. More particularly, the present disclosure relates to methods of forming relaxed semiconductor layers with reduced defects.

2. Description of the Related Art

In the field of semiconductor devices, there is increasing interest in adding high germanium content to silicon, i.e., $Si_{1-x}Ge_x$ to boost the hole mobility of p-type metal-oxide semiconductor (p-MOS) devices. However, high quality, pure large diameter $Si_{1-x}Ge_x$ substrates are expensive to fabricate. Thus, it is desirable to grow high germanium content $Si_{1-x}Ge_x$ layers via heteroepitaxy on the readily available and cost-effective silicon substrates.

One problem with the growth of high germanium content $Si_{1-x}Ge_x$ layers on silicon substrates, however, is the large lattice mismatch between silicon and germanium. Germanium has an in-plane lattice constant that is about 4% larger than the in-plane lattice constant of silicon. When a high germanium content $Si_{1-x}Ge_x$ layer is grown via heteroepitaxy on a silicon substrate, this lattice mismatch between $Si_{1-x}Ge_x$ and Si can result in the formation of a large number of defects, such as threading dislocations, in the $Si_{1-x}Ge_x$ layer, as discussed in more detail below.

In order to form high germanium $Si_{1-x}Ge_x$ layers on silicon substrates, it is known to use a low germanium content $Si_{1-y}Ge_y$ buffer layer as a virtual substrate. That is, a $Si_{1-y}G_y$ buffer layer may be formed on a silicon substrate, and a $Si_{1-x}Ge_x$ layer may subsequently be grown on the $Si_{1-y}Ge_y$ buffer layer. The $Si_{1-y}Ge_y$ buffer layer, which acts as a transition layer between a silicon substrate and a high germanium $Si_{1-x}Ge_x$ epitaxial layer, may be used as a virtual substrate.

The use of a low germanium content $Si_{1-y}Ge_y$ buffer layer for the growth of high germanium content $Si_{1-x}Ge_x$ layers also confers an additional beneficial biaxial strain, which acts as a mobility booster, to the subsequently grown channel layers in a way that can benefit both n-FET (for a tensile Si channel) and p-FET (for a compressive SiGe channel) devices.

For a strain relaxed $Si_{1-y}Ge_y$ buffer layer to serve as a template for the subsequent compressive $Si_{1-x}Ge_x$ (or tensile silicon) growth and that can meet stringent semiconductor fabrication processing needs, it is desirable for the buffer layer to have a smooth and defect-free surface and also for the buffer layer to be 100% relaxed. That is, in addition to being smooth and defect-free, the buffer layer should not be under compressive or tensile strain.

The requirements of a smooth, defect-free surface and 100% lattice relaxation are difficult to meet at the same time. Typically, strain in a semiconductor layer is released through the formation of threading dislocations (TD), which are crystal defects, in the semiconductor material. That is, when a $Si_{1-y}Ge_y$ layer (hereinafter, simply a SiGe layer) is formed on a silicon substrate, relaxation may occur as a result of the generation of defects in the SiGe layer. As long as the SiGe layer is thicker than a corresponding critical thickness, hc, misfits at the interface between the silicon substrate and the SiGe buffer layer lead to the formation of threading dislocations in the SiGe buffer layer that release strain induced by the large lattice-mismatch between the SiGe layer and the silicon substrate.

This relaxation is illustrated, for example, in FIG. 1, which is a graph of critical thickness hc of a SiGe layer on a silicon substrate as a function of germanium concentration, x, in the layer. See D. Houghton, J. Appl. Phys. 70, 2136 (1991). Below the critical thickness, in the stable or meta-stable range, no or minimal relaxation occurs, and the SiGe layers remain pseudomorphically strained to the underlying silicon layer. Above the critical thickness, however, the SiGe layer relaxes due to the formation of defects in the material. As can be seen in FIG. 1, the critical thickness hc decreases as the concentration of germanium in the material increases.

SUMMARY

Some embodiments of the inventive concepts provide methods of forming a layer of silicon germanium. The methods include forming an epitaxial layer of $Si_{1-x}Ge_x$ on a silicon substrate, wherein $0<x<1$, and wherein the epitaxial layer of $Si_{1-x}Ge_x$ has a thickness that is less than a critical thickness, hc, at which threading dislocations form in $Si_{1-x}Ge_x$ on silicon; etching the epitaxial layer of $Si_{1-x}Ge_x$ to form $Si_{1-x}Ge_x$ pillars that define a trench in the epitaxial layer of $Si_{1-x}Ge_x$, wherein the trench has a height and a width, wherein the trench has an aspect ratio of height to width of at least 1.5; and epitaxially growing a suspended layer of $Si_{1-x}Ge_x$ from upper portions of the $Si_{1-x}Ge_x$ pillars, wherein the suspended layer defines an air gap in the trench beneath the suspended layer of $Si_{1-x}Ge_x$.

The epitaxial layer of $Si_{1-x}Ge_x$ may be pseudomorphically strained to the silicon substrate. At least the upper portions of the $Si_{1-x}Ge_x$ pillars may be unstrained.

Each of the $Si_{1-x}Ge_x$ pillars may have a height of at least 10 nm. The trench may have a width of less than 25 nm.

Etching the epitaxial layer of $Si_{1-x}Ge_x$ may include etching completely through the epitaxial layer of $Si_{1-x}Ge_x$ to the silicon substrate.

In some embodiments, the value of x in $Si_{1-x}Ge_x$ may increase in the epitaxial layer of $Si_{1-x}Ge_x$ with distance from the substrate in the suspended layer of $Si_{1-x}Ge_x$. In other embodiments, the value of x in $Si_{1-x}Ge_x$ may decrease in the epitaxial layer of $Si_{1-x}Ge_x$ with distance from the substrate in the suspended layer of $Si_{1-x}Ge_x$.

The suspended layer of $Si_{1-x}Ge_x$ may be formed to be substantially unstrained and may be to have a density of threading dislocations that is less than $10^4/cm^2$.

Each of the $Si_{1-x}Ge_x$ pillars may be formed to have a sufficient height that the upper portions of each of the $Si_{1-x}Ge_x$ pillars becomes substantially unstrained by elastic relaxation after formation of the trench.

The trench may have an aspect ratio of height to width greater than 3.

Each face of the $Si_{1-x}Ge_x$ pillars exposed by etching the epitaxial layer of $Si_{1-x}Ge_x$ to form the $Si_{1-x}Ge_x$ pillars may have a same crystallographic orientation. For example, each face of the $Si_{1-x}Ge_x$ pillars exposed by etching the epitaxial layer of $Si_{1-x}Ge_x$ to form the $Si_{1-x}Ge_x$ pillars may have a <100> crystallographic orientation.

The suspended layer of $Si_{1-x}Ge_x$ may be spaced apart from the silicon substrate by the air gap.

In some embodiments, each of the $Si_{1-x}Ge_x$ pillars has a height, a width and a length, wherein the length is greater than the width, and wherein each of the $Si_{1-x}Ge_x$ pillars has an aspect ratio of height to width that is greater than about 1.

A method of forming a layer of silicon germanium according to further embodiments includes forming an epitaxial layer of $Si_{1-x}Ge_x$ on a silicon substrate, wherein $0<x<1$, and wherein the epitaxial layer of $Si_{1-x}Ge_x$ has a thickness that is less than a critical thickness, hc, at which threading dislocations form in $Si_{1-x}Ge_x$ on silicon; etching the epitaxial layer of $Si_{1-x}Ge_x$ to form a plurality of $Si_{1-x}Ge_x$ pillars that define a plurality of trenches in the epitaxial layer of $Si_{1-x}Ge_x$ therebetween, wherein each of the plurality of trenches has a height, a width and a length, wherein the length of each of the plurality of trenches is greater than the width of each of the plurality of trenches, and wherein each of the plurality of trenches has an aspect ratio of height to width of at least 1.5; and epitaxially growing a suspended layer of $Si_{1-x}Ge_x$ from upper portions of the plurality of $Si_{1-x}Ge_x$ pillars, wherein the suspended layer defines air gaps in the plurality of trenches beneath the suspended layer of $Si_{1-x}Ge_x$.

Each face of each of the plurality of $Si_{1-x}Ge_x$ pillars exposed by etching the epitaxial layer of to form the plurality of $Si_{1-x}Ge_x$ pillars may have a same crystallographic orientation.

The plurality of $Si_{1-x}Ge_x$ pillars may be formed in a repeating pattern.

Each of the plurality of $Si_{1-x}Ge_x$ pillars may have a height such that at least an upper half of each of the plurality of $Si_{1-x}Ge_x$ pillars meets a criterion for complete elastic relaxation.

BRIEF DESCRIPTION OF THE DRAWINGS

The accompanying drawings are included to provide a further understanding of the disclosure and are incorporated in and constitute a part of this application. In the drawings.

DETAILED DESCRIPTION OF EMBODIMENTS

Embodiments of the present inventive concepts now will be described more fully hereinafter with reference to the accompanying drawings. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

Embodiments of the present inventive concepts provide methods for the formation of semiconductor materials and the resulting structures. These embodiments are discussed below in the context of forming relaxed SiGe layers with reduced defects on silicon substrates.

Figure 2:
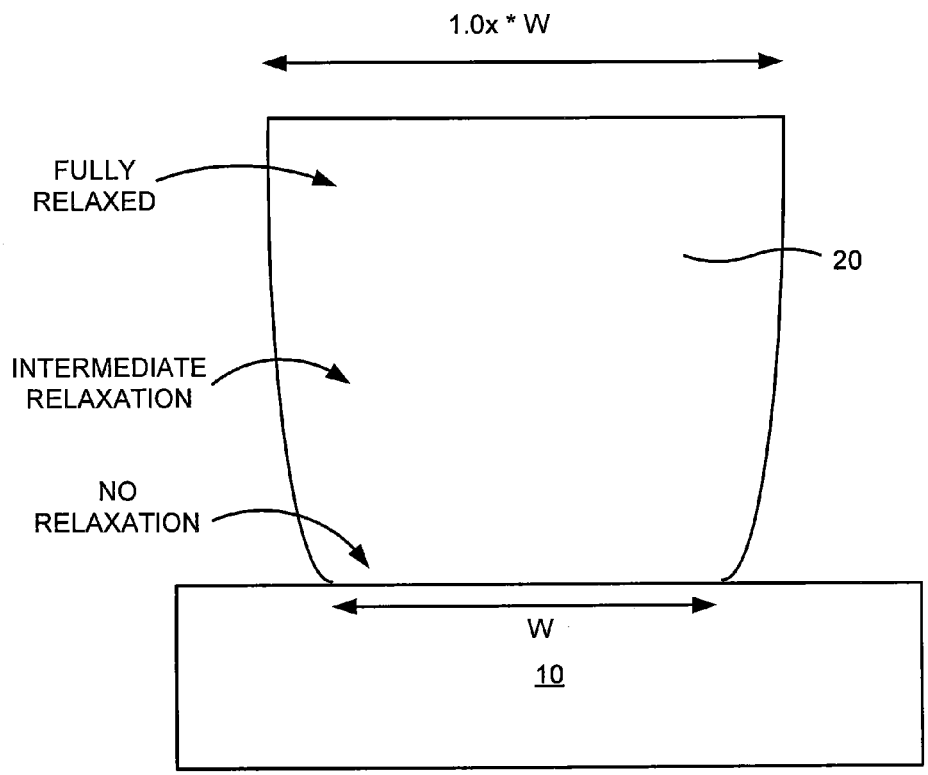
FIG. 2 is a graph illustrating elastic relaxation of $Si_{1-x}Ge_x$ pillars on silicon substrates.

There has been extensive research into epitaxial techniques with the goal of reducing threading dislocation density TDD in SiGe buffer layers to values similar to those found in silicon substrates, which are typically close to zero. In general, TDD reduction can be classified into two approaches, namely, plastic relaxation and elastic relaxation. The plastic relaxation approach involves reduction of defects after they are formed in the material as a result of strain. Plastic relaxation involves annealing layers to remove defects that form due to strain relaxation. Elastic relaxation, on the other hand, utilizes the elastic nature of a semiconductor material in certain conditions. For example, the edge of a thin tall fin of material can relax naturally without the formation of defects, as illustrated in FIG. 2. As shown therein, when a fin 20 of SiGe having a high aspect ratio is formed on a silicon substrate 10, the upper portions of the fin can naturally relax without the formation of threading dislocations. The bottom of the fin 20, near the silicon substrate 10, experiences no relaxation, and remains pseudomorphically strained to the underlying substrate 10. However, depending on the dimensions of the fin 20, the upper portion of the fin 20 may be fully relaxed, while intermediate relaxation may occur near the middle of the fin 20. As illustrated in FIG. 2, a SiGe fin having an in-plane lattice constant that is x % larger than the in-plane lattice constant of silicon may expand to have a width at an upper portion distal to the substrate 10 that is about x % larger than the width of the fin 20 at a lower portion proximal to the substrate 10.

There are other ways of categorizing TDD reduction approaches including, the blanket, compliancy and mesa-patterning techniques.

In the blanket approach, a desired $Si_{1-x}Ge_x$ buffer layer is directly deposited onto a non-patterned blanket silicon wafer. Various optimization means may be applied during or after the epitaxial deposition of the buffer layer to reduce TDD after the buffer layer has become plastically relaxed and the corresponding TDD values are significantly high, i.e., in the E9-E10/cm² ranges. It has been recently recognized that the TDD reduction can only be achieved by increasing the length of misfits, since each misfit comes with two threading dislocations (for forming a dislocation loop). This blanket approach requires a daunting ten orders of magnitude of defect reduction to meet target goals of zero defects/cm². Various advanced TDD reduction schemes have been applied to reach the so-called "thermodynamic limit" of about 1E4/cm², which represents TDD reduction of six orders of magnitude. This is a significant achievement, but does not meet the desired goals.

The compliancy approach utilizes a sacrificial thin and compliant layer beneath the buffer layer to force the defects generated to move downwards instead of going up to the top of buffer layer surface. However, a costly SOI wafer is usually needed as the starting wafer for this technique.

The mesa-patterning approach, which differs significantly from the ones described above, requires patterning and forming islands of mesas either (a) on the substrate or (b) on the buffer layer.

Mesa-patterning of substrates has been demonstrated extensively. For example, Zhang et al. (X. G. Zhang, A. Rodriguez, X. Wang, P. Li, F. C. Jain, and J. E. Ayers, "Complete removal of threading dislocations from mismatched layers by patterned heteroepitaxial processing," Appl. Phys. Lett., vol. 77, no. 16, p. 2524, 2000; X. G. Zhang, P. Li, G. Zhao, D. W. Parent, F. C. Jain, and J. E. Ayers, "Removal of threading dislocations from patterned heteroepitaxial semiconductors by glide to sidewalls," J. Electron. Mater., vol. 27, no. 11, pp. 1248-1253, November 1998), showed that TDD can be reduced significantly by patterning the wafer as the starting step. Zhang et al. demonstrated a TDD reduction down to $2E4/cm^2$ of ZnSe on GaAs. In fact, this value is even lower than that of the GaAs substrate ($E5/cm^2$), which was attributed to the TD glide to the sidewalls, as promoted by the natural presence of the image forces from mesa structures. Molstad et al., (J. Molstad, P. Boyd, J. Markunas, D. J. Smith, E. Smith, E. Gordon, and J. H. Dinan, "Epitaxial growth of CdTe on (211) silicon mesas formed by deep reactive ion etching," J. Electron. Mater., vol. 35, no. 8, pp. 1636-1640, August 2006), also demonstrated an extreme case of epitaxially growing a significantly large lattice mismatch of CdTe on silicon (~20%) with reasonably low TDD values of $1E6/cm^2$. Similar but limited success has been demonstrated for a $Si_{1-x}Ge_x$ buffer on Si due to the significantly higher stiffness of $Si_{1-x}Ge_x$, which renders it much more difficult to activate TDs to glide. However, no reports are available for corresponding TDD values lower than $E4/cm^2$ using this approach. In addition, there is also a fundamental issue of not being able to achieve 100% relaxation using this scheme since the layer deposited on top will have to share the strain, which prevents the strain of the top layer from being 100% relaxed.

Another variation of mesa patterning is referred to as Epitaxial Lateral Overgrowth (ELO). In a typical ELO process, mesa stripes that define trenches are formed in a silicon substrate with a patterned oxide mask. A buffer layer is then selectively grown from the bottom of the trench (i.e., silicon substrate) and extended above the trench to merge and form the desired buffer layer. The ELO technique can potentially produce regions away from the trench opening with low defects. However, the area directly above the mesa stripes may remain defective. The ELO scheme has been popular for devices on certain types of materials, such as light emitting devices utilizing GaN on Si(111), since such devices can be selectively formed on the defect-free areas. However, in general, ELO cannot be applied to CMOS fabrication since a CMOS process requires all areas to be useful for devices.

Mesa-patterning directly on a buffer layer has also been demonstrated. In this scheme, threading dislocations generated inside the mesa due to lattice-mismatch can be removed provided that TDs can glide into the free space between mesa islands with a high temperature anneal. In summary, this TDD reduction scheme benefits from using a mesa-patterning scheme due to the combination of (a) annealing to set dislocations into motion and the proximity of mesa sidewalls which act as dislocation sinks using the image force from the mesa structure, and (b) the availability of the free spaces between mesas for TDs to glide into to absorb the total strain required.

Mesa-patterning has advantages over the non-patterning blanket approach described above, in that TDD reduction using this type of scheme has been shown to have the potential of lowering TDD values to $1E4/cm^2$ or lower. Nonetheless, the corresponding empty spaces created from the mesa-patterning not only waste real estate on the silicon wafer, but also create a topological issue for the subsequent regular CMOS semiconductor fabrication.

Moreover, the mesa-patterning approach still uses plastic relaxation. It also relies heavily on the activation of all TDs to glide, which is quite challenging, especially for stiff materials with high Young's modulus.

While the mesa-pattering with elastic relaxation technique possesses a great potential to reduce TDD (of the mesas) to values lower than those of plastic ones, this technique is limited by the recovery of the free space in an appropriate manner and the need for additional TDD reduction.

According to some embodiments, a pseudomorphically strained $Si_{1-x}Ge_x$ layer is mesa-patterned to relieve strain in at least upper portions of the mesas. An air-gapped epitaxial growth process is then performed, which results in the formation of a relaxed buffer layer that provides a substrate capable of meeting the stringent TDD requirements and CMOS fabrication process requirements. Some embodiments enjoy the benefits of elastic relaxation with no TD generation at all. That is, by forming mesas with vastly reduced threading dislocations, plastic relaxation is avoided. The mesas are then used to grow a 100% relaxed layer that bridges over air gaps between the mesas. The technique described herein is referred to as an elastically mesa-patterned, or eMESA, epitaxial growth technique.

Figure 3:
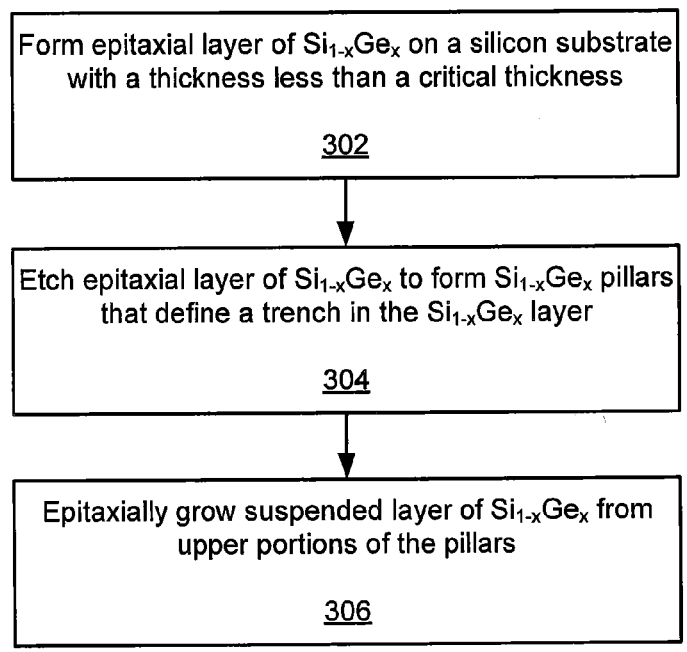
FIG. 3 is a flowchart illustrating operations of forming structures according to some embodiments.

Embodiments of the present inventive concepts are illustrated in FIG. 3, which is a flowchart of operations for forming a relaxed, defect free, epitaxial layer. Referring to FIG. 3, in a first operation 302, an epitaxial layer of $Si_{1-x}Ge_x$, where $0<x<1$, is formed on a defect-free silicon substrate. The epitaxial layer of $Si_{1-x}Ge_x$ is formed to have a thickness that is less than the critical thickness of the $Si_{1-x}Ge_x$ material. As noted above, the critical thickness hc of a layer of $Si_{1-x}Ge_x$ is a function of the germanium content of the material. Thus, the critical thickness hc of the layer of $Si_{1-x}Ge_x$ depends on the value of "x" in the formula $Si_{1-x}Ge_x$.

Because the epitaxial layer of $Si_{1-x}Ge_x$ is grown to a thickness that is less than the critical thickness hc, the epitaxial layer of $Si_{1-x}Ge_x$ remains pseudomorphically strained to the underlying template, namely, the silicon substrate. No strain relaxation occurs, and threading dislocations may not be formed in the epitaxial layer of $Si_{1-x}Ge_x$. Thus, the epitaxial layer of $Si_{1-x}Ge_x$ may remain defect-free.

The epitaxial layer of $Si_{1-x}Ge_x$ thus formed is completely strained in a meta-stable manner so that no dislocations may be generated. The epitaxial layer of $Si_{1-x}Ge_x$ can be grown using conventional chemical vapor deposition (CVD) techniques. Some other deposition techniques, such as physical vapor deposition (PVD) may not be suitable, since they may result in the deposition of a poly-crystalline layer, which defeats benefit of high mobility benefit that can exist when the epitaxial layer of $Si_{1-x}Ge_x$ is single crystalline. Other deposition techniques, such as molecular beam epitaxy (MBE) are possible, but may not be beneficial from a manufacturing standpoint due to slow growth rates. The growth condition from a regular CVD epitaxial process can reduce threading dislocations to the hc limit, but this hc is actually quite small for reasonably high germanium content SiGe to have practical use.

The thickness of this SiGe epitaxial layer can be selected to provide a desired height of a subsequent mesa pillar to be formed from the layer, but may be thin enough such that the layer remains in the meta-stable growth region to avoid TD generation in the layer.

Figure 4A:
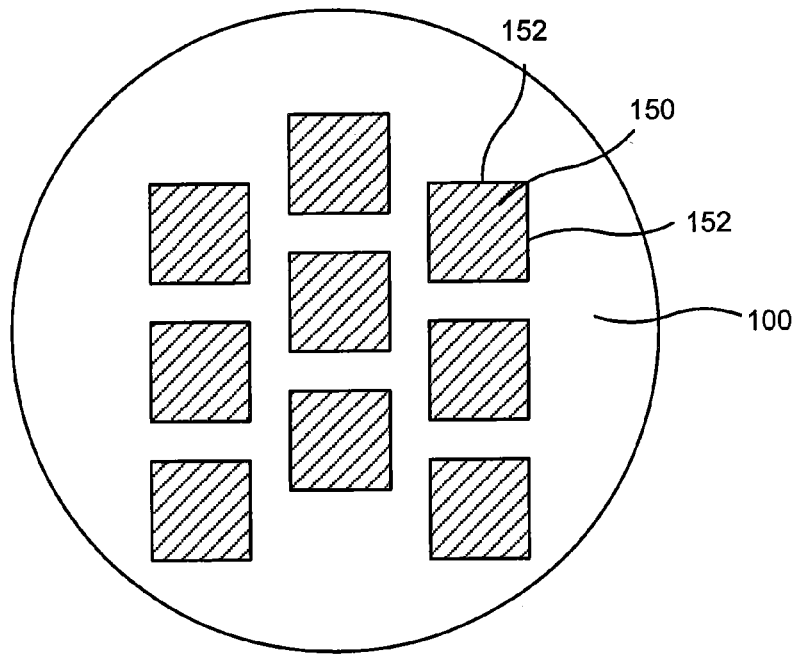
FIGS. 4A and 4B are plan views of silicon wafers on which a plurality of $Si_{1-x}Ge_x$ pillars or fins are formed according to some embodiments.
Figure 5:
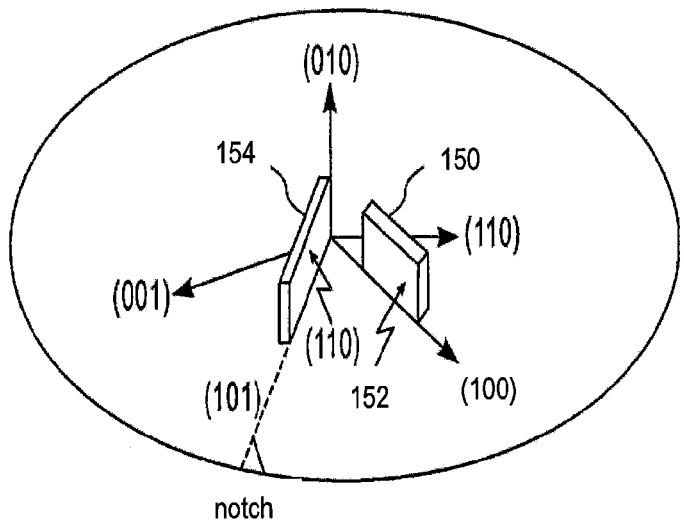
FIG. 5 is an isometric view illustrating the formation of $Si_{1-x}Ge_x$ mesas having (100) oriented faces according to some embodiments.
Figure 6:
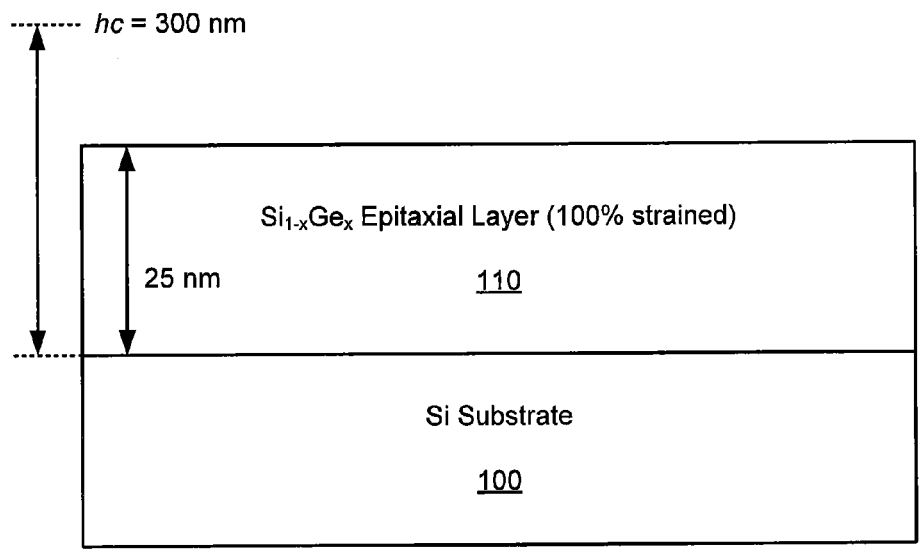
FIGS. 6-10 are schematic cross sections illustrating the formation of $Si_{1-x}Ge_x$ layers according to some embodiments.

Referring to FIGS. 3 and 4A, in a second operation 304, the epitaxial layer of $Si_{1-x}Ge_x$ is etched to form a plurality of mesa pillars or fins 150 that define one or more trenches in the $Si_{1-x}Ge_x$ layer. Each of the faces 152 of the pillars 150 in the epitaxial layer of $Si_{1-x}Ge_x$ may be oriented in a same crystallographic direction. For example, each of the faces 152 of the pillars 150 in the epitaxial layer of $Si_{1-x}Ge_x$ may be (100) faces (i.e., oriented in the <100> direction). This is illustrated generally in FIG. 5, which shows two mesa pillars 150, 154. The mesa pillar 150 is oriented so that each face of the mesa pillar 150 is a (100) face.

When the mesa pillars 150 are formed, elastic relaxation occurs such that upper portions of the mesa pillars 150 relax and become unstrained. Because the relaxation occurs in an elastic manner, rather than through the formation of defects in the $Si_{1-x}Ge_x$ material, the upper portions of the mesa pillars 150 may be both relaxed and defect-free.

Figure 4B:
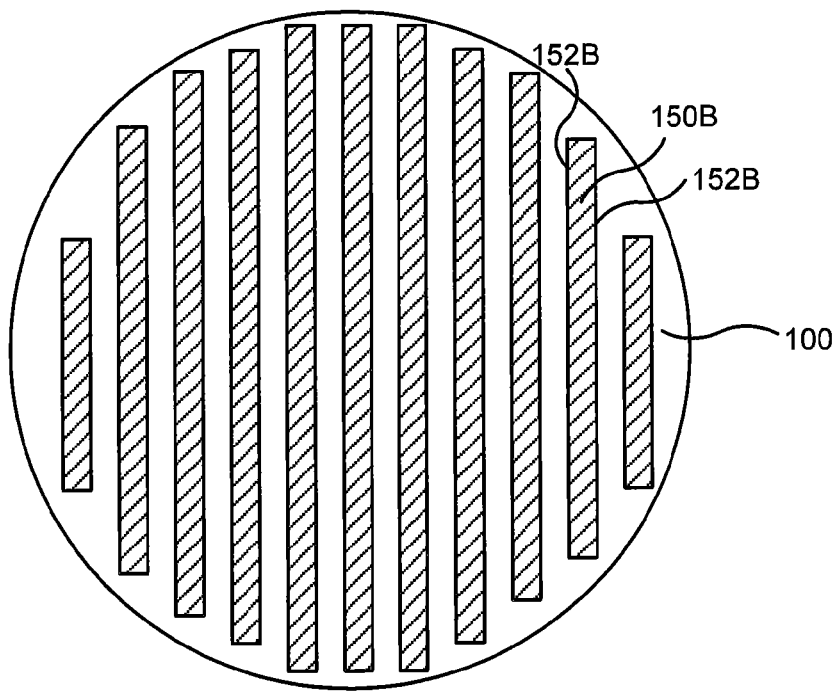

FIG. 4B illustrates mesa fins 150B having faces 152B formed on a silicon substrate 100. Each of the faces 152B of the fins 150B may be oriented in a same crystallographic direction, such as the <100> direction.

Referring again to FIG. 3, in operation 306, a suspended epitaxial layer of $Si_{1-x}Ge_x$ is then grown from upper portions of the pillars 150. The spacing between the pillars is chosen so that the epitaxial growth proceeds preferentially from the unstrained, defect-free upper portions of the mesa pillars 150. The $Si_{1-x}Ge_x$ material growing from the upper portions of the pillars grows laterally over the trenches and coalesces to form a continuous layer of unstrained, defect-free $Si_{1-x}Ge_x$ over air gaps in the trenches.

Accordingly, the eMESA techniques described herein utilize elastically relaxed mesa-patterning followed by growth of an air-gapped epitaxial layer from the relaxed mesas. This approach may be used for other types of materials, including for example, InGaAs or InP, that are grown using heteroepitaxy and that can suffer from threading dislocations associated with plastic relaxation.

Figure 1:
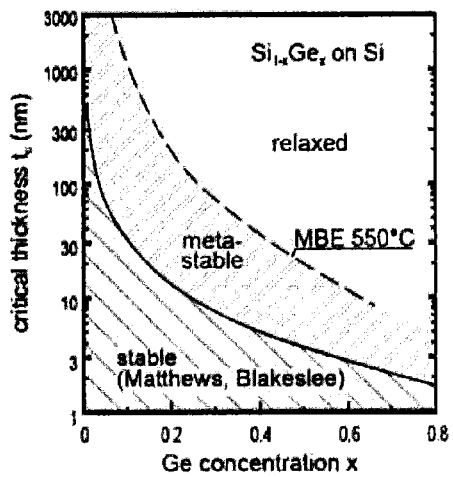
FIG. 1 is a graph illustrating the relationship between critical thickness and germanium concentration in $Si_{1-x}Ge_x$ layers on silicon substrates.

An example of the formation of a thickness-independent defect-free $Si_{0.8}Ge_{0.2}$ SRB on regular silicon wafers is illustrated in FIGS. 6-10. Referring to FIG. 1, for a $Si_{0.8}Ge_{0.2}$ layer having a mole fraction of germanium of 0.2 (i.e., a germanium concentration of 20%), the critical thickness hc is approximately 300 nm. Accordingly, referring to FIG. 6, an epitaxial $Si_{0.8}Ge_{0.2}$ layer having a thickness of 25 nm is epitaxially grown on a silicon wafer. A thickness of 25 nm is well below the critical thickness of 300 nm. Moreover, at a thickness of 25 nm, the $Si_{0.8}Ge_{0.2}$ is in a meta-stable form. Thus, the $Si_{0.8}Ge_{0.2}$ layer is completely strained to the underlying silicon layer, and is expected to have no defects formed due to relaxation.

Figure 7:
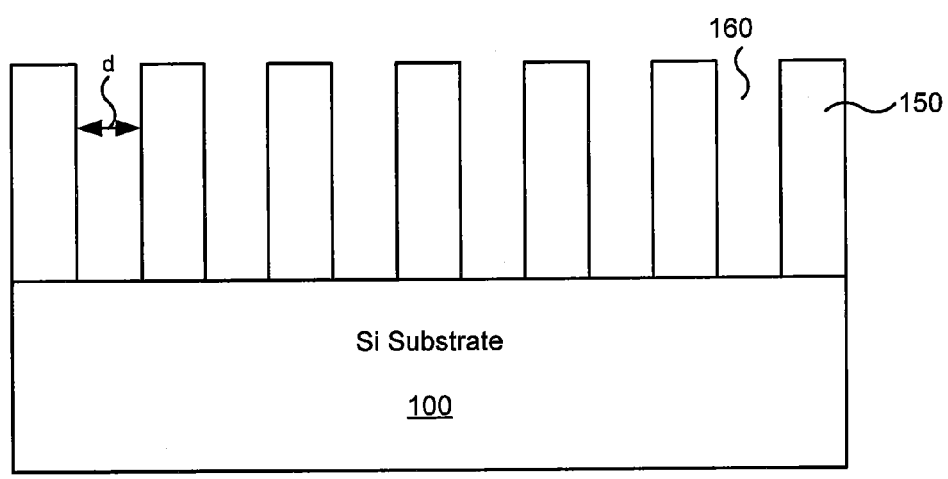

Referring to FIG. 7, the $Si_{0.8}Ge_{0.2}$ layer is then patterned (e.g., using an oxide or other hard mask, such as $Al_2O_3$ or $Si_3N_4$, etc.) and etched to form mesa pillars 150 that define trenches 160 therebetween. In this manner, a sea of mesa pillars or fins 150 are formed in a periodic structure. Each of the mesa pillars 150 may have a height of about 10 nm to 300 nm. In particular embodiments, each pillar may have dimensions of 25 nm width×25 nm height×50 nm length. The pillars may have other lengths, e.g., 40 nm to 60 nm or longer/shorter. Mesa pillars of $Si_{0.8}Ge_{0.2}$ created in this manner may be 100% relaxed at the top portions thereof due to the elastic relaxation nature of a thin, tall fin or pillar. In particular, it is desirable for the pillars to have dimensions selected such that at least the upper half of the pillars is 100% relaxed.

The spacing between pillars 150 (and among pillars at the corners), indicated as "d" in FIG. 7, is selected to be narrow enough to create a relatively high aspect ratio structure so that air gaps can be formed in the trenches 160 due to the natural "bread-loafing" effect of the subsequent epitaxial growth using a typical chemical vapor deposition (CVD) process. In particular, the mesa pillars may be spaced apart from one another by a distance d that is less than 25 nm, and in some cases by about 15 nm or less.

In general, the pillars 150 are formed so that the trenches have an aspect ratio (defined as height of the trench divided by the width of the trench) that is greater than 3. In some embodiments, the aspect ratio of the trenches may be at least 1.5. In further embodiments, the aspect ratio may be greater than about 4.

The pillars 150 are formed to have an aspect ratio (defined as the ratio of pillar height to pillar width) of at least about 1, and in some cases greater than 1, to promote relaxation. Each pillar 150 has a height, a length and a width, where the width of the pillar is less than or equal to its length.

The pillars 150 are formed in such a way so that all faces correspond to (100) planes. For example, all of the side faces of the pillars 150 may be oriented at 45° to the <110> notch of a silicon wafer. Epitaxial growth that proceeds from the (100) faces of the pillars 150 may avoid the undesirable (111) diamond-facet formation, while also reducing or eliminating the formation of grain boundaries when the epitaxial materials growing from the pillars merge to form a continuous layer. In addition, it is well known that SiGe epitaxy on (100) faces can be intrinsically defect-free (while within the meta-stable region), while SiGe epitaxy on (110) and (111) surfaces is prone to being very defective in the same conditions.

Figure 8:
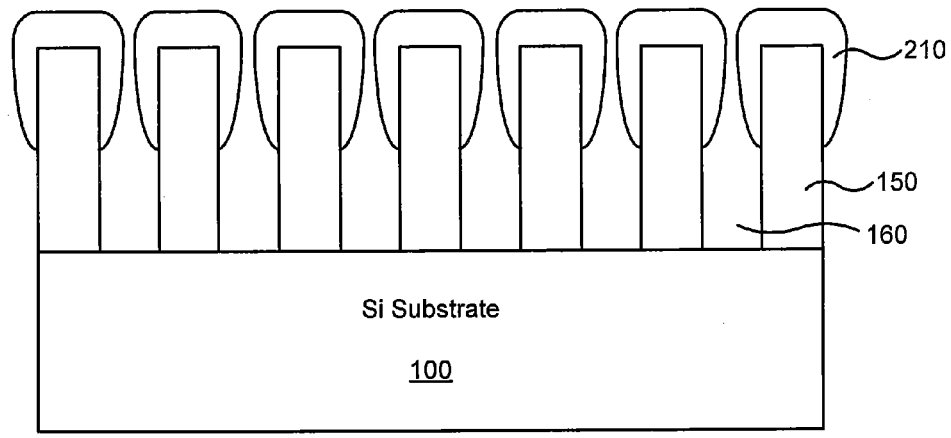

Referring now to FIG. 8, the top portions of the pillars 150, which are 100% relaxed due to the elastic relaxation described above, act as seed layers for the growth of epitaxial regions 210 having the same germanium content, i.e., $Si_{0.8}Ge_{0.2}$, as the pillars 150. Epitaxial growth of the regions 210 may be performed using CVD or any other suitable growth technique. For example, a typical CVD condition of SiGe EPI growth using $SiH_4$ and $GeH_4$ precursors at a temperature of at 500 C to 600 C and a pressure of 20 mTorr to 100 mTorr can form breadloafing in a trench with an aspect ratio >2.

Figure 9:
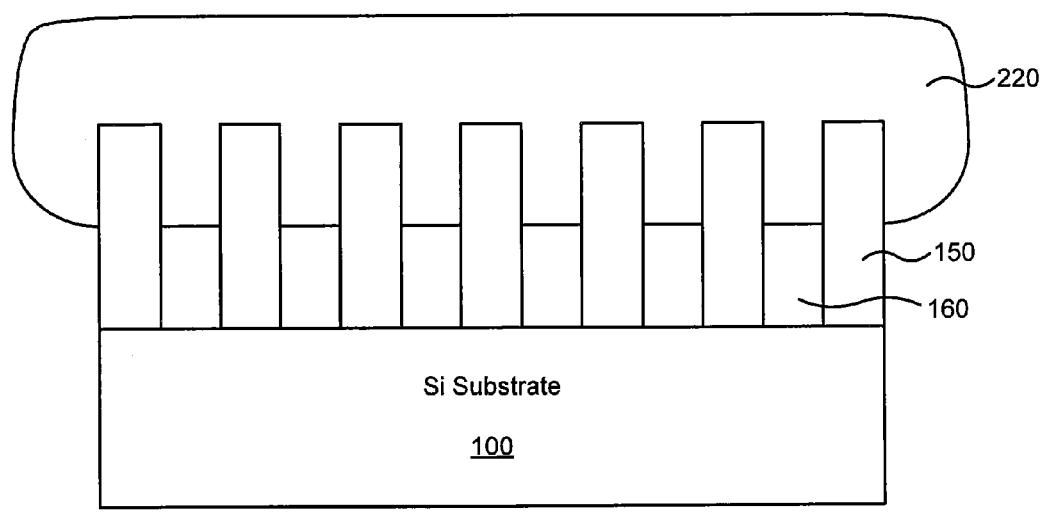

Referring to FIG. 9, as growth proceeds, the regions 210 coalesce over the trenches 160 to form a continuous epitaxial layer 220. The epitaxial layer 220 of $Si_{0.8}Ge_{0.2}$ is formed due to a so-called "bread-loafing" effect, in which the suspended epitaxial layer 220 of $Si_{0.8}Ge_{0.2}$ is formed over air gaps in the trenches 160.

The epitaxial layer 220 formed in this manner may be naturally relaxed and defect-free, since the seed layer, consisting of the pillars 150, is already 100% relaxed and therefore does not have a lattice mismatch with the epitaxial layer 200.

That is, there is no lattice mismatch between the seed layer, i.e., the top portions of the pillars 150, and the epitaxial layer 220 grown on the pillars, since both have the same Ge content. This also creates a facile condition for the epitaxy due to the lack of strain in the pillars 150. In addition, SiGe alloys are completely miscible over all germanium contents for the growth temperatures used in epitaxy, and the surface energy of SiGe is lower than that of Si. Therefore, if the strain in a growing layer is small, as in this case, then a two-dimensional growth in the Frank-van der Merwe mode is produced due to the minimum surface energy requirement in a similar fashion to that of Si homoepitaxy.

All relevant faces (especially the top portion) of the growing epitaxial material 210 are of the same $Si_{0.8}Ge_{0.2}$ materials with the same Ge content on the same (100) planes. Thus, from the perspective of adatoms present during epitaxial growth, the epitaxial growth is effectively insensitive to topological issues due to the mesa patterning. The epitaxial material 210 grows in a 2D layer-by-layer manner on the top portion of the fins. In contrast, epitaxial growth at the bottom portion of the pillars 150 is hindered by the closing of the entrances to the trenches from the top portions thereof, resulting in the formation of voids, or air-gaps, in the trenches 160 between the pillars 150. This is promoted by the high aspect ratio of the trenches.

Figure 10:
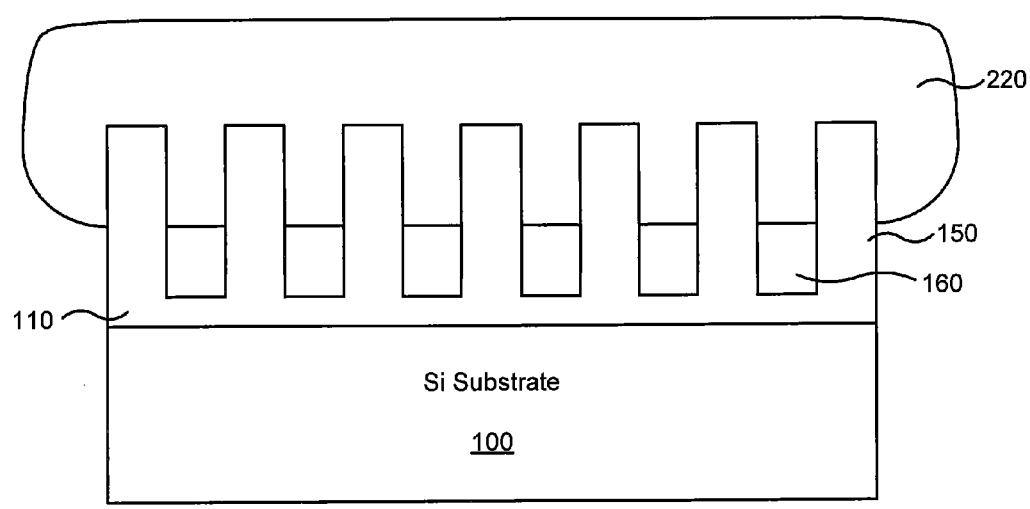

Referring to FIG. 10, in some embodiments, the trenches 160 may not be formed to reach all the way to the substrate 100, but may terminate within the epitaxial layer 110.

The voids, or air gaps, between/among the pillars may inhibit any defects that originate at the bottom of the pillars or trenches from reaching the epitaxial layer 220. Moreover, the epitaxial layer 220 can be grown as thick as needed, while still remaining relaxed and defect-free.

After formation of the epitaxial layer 220, the layer 220 can be annealed, for example in a hydrogen atmosphere, to remove point defects or other defects arising from the merging of the epitaxial regions 210 over the trenches 160, as well as to smooth the surface of the epitaxial layer 220. Any residual roughness of the epitaxial layer 220 can be removed through a standard CMP (chemical-mechanical polishing) process.

The newly formed epitaxial layer 220 may be used as a virtual substrate for the formation of subsequent semiconductor layers.

Some embodiments of the inventive concepts provide methods of forming defect-free, strain-relief-buffer (SRB) layers via heteroepitaxy on lattice-mismatched substrates, such as silicon wafers. These layers may be formed using elastic relaxation of mesa patterned features in a defect free $Si_{1-x}Ge_x$ layer. This approach may avoid the formation of defects from the start, thus avoiding the need to remove defects by annealing after growth. By forming the epitaxial layer 220 such that voids are formed in the trenches below the layer 220, defects that may be present in the bottoms of the trenches may be inhibited from affecting the epitaxial layer 220. Moreover, the thickness of the epitaxial layer is not restricted, because there is no lattice mismatch with the seed layer, namely, the upper portions of the pillars 150.

The mesa-patterned pillars or fins 150 can be formed in a periodic structure with dimensions that meet 100% elastic relaxation criteria at least on the majority portion of the pillar. 100% elastic relaxation means that the lattice constant of the SiGe layer grown and elastically relaxed is now exactly following that of the single crystal with no defects generated. For example, for a pillar having dimensions of 25 nm width×30 nm height×50 nm length, at least a top half of the pillar is 100% relaxed. Many other dimensions, such as 10 nm×10 nm×10 nm, 10 nm×10 nm×50 nm (i.e., tall thin pillars), or even a mixture of various relevant dimensions, may be used as long as the above criteria are met. In general, the pillars may have a height of at least about 20 nm to 30 nm and an aspect ratio of at least 1. The pillar dimensions may be selected to reduce/minimize the overall cost of mesa-patterning, including masking, oxide deposition, lithographic patterning, etch processing and clean, etc.

The portion of the pillars which are 100% relaxed must be large enough to serve as the seed layer for the subsequent epitaxial growth so that the there are no lattice-mismatch issues between the buffer layer and the underlying pillars.

The pillars can be oriented to a certain fixed direction (e.g., <100>, i.e., 45° to the <110> wafer notch, or other directions) in a way so that all exposed surfaces of the pillar are of the same type, e.g., (100), i.e., 45° to the <110> wafer notch. Other orientations can also be considered as long as the resulting surfaces are of the same type.

The relative positions of pillars may be selected such that the separation distance d between pillars is small enough that the corresponding aspect ratio is large enough to induce the formation of voids at the base of the pillars. That is, the distance between pillars (and among pillars at their corners) are selected to be narrow enough to create a relatively high aspect ratio gap between pillars so that air gaps (or voids) can be formed due to the natural bread-loafing effect of the subsequent epitaxial growth using a conventional CVD process.

The voids formed in this manner must be large enough that any defects that exist or that are generated at the bottoms of the trenches are disconnected and will not travel to the tops of the pillars.

The germanium content of the buffer layer 220 can be varied to meet various target requirements. For example, the germanium content of the buffer layer 220 may be graded from a first germanium content to a second germanium content as desired. Moreover, the buffer layer 220 can be grown as thick as needed due to the lack of strain in the layer.

The $Si_{1-x}Ge_x$ buffer layer 220 can have a threading dislocation density of less than $1E4/cm^2$, independent of germanium content, due to complete elastic relaxation. In some embodiments, the $Si_{1-x}Ge_x$ buffer layer 220 can have a threading dislocation density of less than $1E3/cm^2$, and in some embodiments, the $Si_{1-x}Ge_x$ buffer layer 220 can have a threading dislocation density of less than $1E2/cm^2$.

The techniques described herein can be used to form donor wafers for SiGeOI by depositing a thick SiGe layer onto a SiGe buffer layer 220 formed using the eMESA methods described herein. This is because the SiGe buffer layer 220 is thickness-independent and completely relaxed.

Although some embodiments of the eMESA method involve patterning and etching steps, as well as epitaxial re-growth steps, the cost of such processing steps may be outweighed by the benefits of providing SiGe layers with very low TDD values as described herein.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "between", "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments are described herein with reference to cross-section illustrations that are schematic illustrations of idealized embodiments (and intermediate structures). The thickness of layers and regions in the drawings may be exaggerated for clarity. Additionally, variations from the shapes of the illustrations as a result, for example, of manufacturing techniques and/or tolerances, are to be expected. Thus, embodiments illustrated herein should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Some embodiments are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes.

It is to be understood that the functions/acts noted in flowchart blocks may occur out of the order noted in the operational illustrations. For example, two blocks shown in succession may in fact be executed substantially concurrently or the blocks may sometimes be executed in the reverse order, depending upon the functionality/acts involved.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

What is claimed is:

1. A method of forming a layer of silicon germanium, comprising:

forming an epitaxial layer of $Si_{1-x}Ge_x$ on a silicon substrate, wherein $0<x<1$, wherein the epitaxial layer of $Si_{1-x}Ge_x$ has a thickness that is less than a critical thickness, hc, and wherein threading dislocations form in $Si_{1-x}Ge_x$ on silicon above the critical thickness, hc;

etching the epitaxial layer of $Si_{1-x}Ge_x$ to form $Si_{1-x}Ge_x$ pillars that define a trench in the epitaxial layer of $Si_{1-x}Ge_x$, wherein the trench has a height and a width, and wherein the trench has an aspect ratio of height to width of at least 1.5; and epitaxially growing a suspended layer of $Si_{1-x}Ge_x$ from upper portions of the $Si_{1-x}Ge_x$ pillars, wherein the suspended layer of $Si_{1-x}Ge_x$ defines an air gap in the trench beneath the suspended layer of $Si_{1-x}Ge_x$.

2. The method of claim 1, wherein at least the upper portions of the $Si_{1-x}Ge_x$ pillars are unstrained.

3. The method of claim 1, wherein each of the $Si_{1-x}Ge_x$ pillars has a height of at least 10 nm.

4. The method of claim 1, wherein the trench has a width of less than 25 nm.

5. The method of claim 1, wherein etching the epitaxial layer of $Si_{1-x}Ge_x$ comprises etching completely through the epitaxial layer of $Si_{1-x}Ge_x$ to the silicon substrate.

6. The method of claim 1, wherein x increases in the suspended layer of $Si_{1-x}Ge_x$ with distance from the silicon substrate.

7. The method of claim 1, wherein x decreases in the suspended layer of $Si_{1-x}Ge_x$ with distance from the silicon substrate.

8. The method of claim 1, wherein the suspended layer of $Si_{1-x}Ge_x$ is formed to be substantially unstrained and is formed to have a density of threading dislocations that is less than $10^4/cm^2$.

9. The method of claim 1, wherein each of the $Si_{1-x}Ge_x$ pillars is formed to have a sufficient height that the upper portions of each of the $Si_{1-x}Ge_x$ pillars becomes substantially unstrained by elastic relaxation after formation of the trench.

10. The method of claim 1, wherein the trench has an aspect ratio of height to width greater than 3.

11. The method of claim 1, wherein surfaces of the $Si_{1-x}Ge_x$ pillars have a same crystallographic orientation.

12. The method of claim 11, wherein the surfaces of the $Si_{1-x}Ge_x$ pillars have a <100> crystallographic orientation.

13. The method of claim 1, wherein each of the $Si_{1-x}Ge_x$ pillars has a height, a width and a length, wherein the length is greater than the width, and wherein each of the $Si_{1-x}Ge_x$ pillars has an aspect ratio of height to width that is greater than about 1.

14. A method of forming a layer of silicon germanium, comprising:

forming an epitaxial layer of $Si_{1-x}Ge_x$ on a silicon substrate, wherein $0<x<1$, wherein the epitaxial layer of $Si_{1-x}Ge_x$ has a thickness that is less than a critical thickness, hc, and wherein threading dislocations form in $Si_{1-x}Ge_x$ on silicon above the critical thickness, hc;

etching the epitaxial layer of $Si_{1-x}Ge_x$ to form a plurality of $Si_{1-x}Ge_x$ pillars that define a plurality of trenches in the epitaxial layer of $Si_{1-x}Ge_x$ therebetween, wherein each of the plurality of trenches has a height, a width and a length, wherein the length of each of the plurality of trenches is greater than the width of each of the plurality of trenches, and wherein each of the plurality of trenches has an aspect ratio of height to width of at least 1.5; and epitaxially growing a suspended layer of $Si_{1-x}Ge_x$ from upper portions of the plurality of $Si_{1-x}Ge_x$ pillars, wherein the suspended layer of $Si_{1-x}Ge_x$ defines air gaps in the plurality of trenches beneath the suspended layer of $Si_{1-x}Ge_x$.

15. The method of claim 14, wherein surfaces of each of the plurality of $Si_{1-x}Ge_x$ pillars have a same crystallographic orientation.

16. The method of claim 14, wherein the plurality of $Si_{1-x}Ge_x$ pillars is formed in a repeating pattern.

17. The method of claim 14, wherein each of the plurality of $Si_{1-x}Ge_x$ pillars has a height such that at least an upper half of each of the plurality of $Si_{1-x}Ge_x$ pillars meets a criterion for complete elastic relaxation.

18. The method of claim 14, wherein x varies in the suspended layer of $Si_{1-x}Ge_x$.

19. The method of claim 14, wherein surfaces of each of the plurality of $Si_{1-x}Ge_x$ pillars have a <100> crystallographic orientation.

20. The method of claim 1, wherein x varies in the suspended layer of $Si_{1-x}Ge_x$.

* * * * *